(12) United States Patent
Tuominen

(10) Patent No.: US 9,999,136 B2
(45) Date of Patent: Jun. 12, 2018

(54) METHOD FOR FABRICATION OF AN ELECTRONIC MODULE AND ELECTRONIC MODULE

(71) Applicant: GE Embedded Electronics Oy, Helsinki (FI)

(72) Inventor: Risto Tuominen, Helsinki (FI)

(73) Assignee: GE Embedded Electronics Oy, Helsinki (FI)

( * ) Notice: Subject to any disclaimer, the term of this patent is extended or adjusted under 35 U.S.C. 154(b) by 0 days. days.

(21) Appl. No.: 14/569,900

(22) Filed: Dec. 15, 2014

(65) Prior Publication Data

US 2016/0174387 A1 Jun. 16, 2016

(51) Int. Cl.
*H05K 3/30* (2006.01)
*H05K 1/02* (2006.01)
(Continued)

(52) U.S. Cl.
CPC .............. *H05K 3/30* (2013.01); *H01L 21/486* (2013.01); *H01L 23/5384* (2013.01); *H01L 23/5389* (2013.01); *H01L 24/00* (2013.01); *H01L 24/24* (2013.01); *H01L 24/82* (2013.01); *H01L 25/065* (2013.01); *H05K 1/0298* (2013.01); *H05K 1/115* (2013.01); *H05K 1/185* (2013.01); *H05K 3/429* (2013.01); *H05K 3/4644* (2013.01); *H05K 3/4697* (2013.01); *H01L 2224/32225* (2013.01); *H01L 2224/83005* (2013.01);
(Continued)

(58) Field of Classification Search
USPC .............. 257/211, E21.5, E21.705; 174/257; 216/17; 438/127, 108
See application file for complete search history.

(56) References Cited

U.S. PATENT DOCUMENTS 5,407,864 A 4/1995 Kim
5,936,847 A 8/1999 Kazle
(Continued)

*Primary Examiner* — Marcos D Pizarro
*Assistant Examiner* — Lawrence Tynes, Jr.
(74) *Attorney, Agent, or Firm* — Seppo Laine Oy

(57) ABSTRACT

The present invention concerns an electronic module with at least one component embedded in insulating material. The electronic module comprises a first insulating material having a first surface and a second surface and a thickness between the first surface and the second surface, at least one opening through the first insulating material, a second insulating material on the second surface of the first insulating material, at least one component embedded in the second insulating material, at least one conductive pattern in the at least one opening, the at least one conductive pattern having a first surface and a second surface, wherein the second surface faces the second insulating material and the first surface faces away from the second insulating material and a distance between the first surface of the first insulating material and the second surface of the at least one conductive pattern is less or greater than the thickness of the first insulating material, an adhesive between the first insulating material and the at least one component, and connection elements between the at least one conductive pattern and the at least one component. The present invention further concerns a method for fabrication of an electronic module with at least one component embedded in an insulating layer.

20 Claims, 16 Drawing Sheets

(51) Int. Cl.
*H05K 1/11* (2006.01)
*H05K 1/18* (2006.01)
*H05K 3/42* (2006.01)
*H05K 3/46* (2006.01)
*H01L 23/00* (2006.01)
*H01L 23/538* (2006.01)
*H01L 21/48* (2006.01)
*H01L 25/065* (2006.01)

(52) U.S. Cl.
CPC ............. *H01L 2224/83192* (2013.01); *H01L 2224/92144* (2013.01); *H01L 2924/12041* (2013.01); *H01L 2924/1433* (2013.01); *H01L 2924/1434* (2013.01); *H01L 2924/1461* (2013.01); *H01L 2924/19105* (2013.01); *H05K 2201/10522* (2013.01); *H05K 2201/10674* (2013.01); *H05K 2203/0588* (2013.01); *H05K 2203/1469* (2013.01)

(56) References Cited

U.S. PATENT DOCUMENTS

| | | | |
|---|---|---|---|
| 6,038,133 A | 3/2000 | Nakatani et al. | |
| 6,350,633 B1 | 2/2002 | Lin | |
| 8,240,033 B2 | 8/2012 | Tuominen et al. | |
| 8,581,109 B2 | 11/2013 | Tuominen et al. | |
| 2002/0117743 A1 | 8/2002 | Nakatani et al. | |
| 2003/0141596 A1* | 7/2003 | Nakamura | H01L 21/4846 257/758 |
| 2010/0019368 A1* | 1/2010 | Shin | H01L 23/24 257/686 |
| 2010/0236822 A1* | 9/2010 | Furutani | H01L 21/4857 174/260 |
| 2011/0221069 A1* | 9/2011 | Kunimoto | H01L 23/5389 257/774 |
| 2012/0299888 A1* | 11/2012 | Kim | G02F 1/13452 345/205 |
| 2014/0347833 A1* | 11/2014 | Horiuchi | H01L 23/5386 361/761 |
| 2015/0061139 A1* | 3/2015 | Yap | H01L 24/26 257/773 |
| 2015/0069623 A1* | 3/2015 | Tsai | H01L 21/563 257/774 |

* cited by examiner

METHOD FOR FABRICATION OF AN ELECTRONIC MODULE AND ELECTRONIC MODULE

TECHNICAL FIELD OF THE INVENTION

The present invention relates to a method for fabrication of an electronic module with at least one component embedded in an insulating layer. Such solutions can be alternatively also referred to as circuit-board or module structures, which contain buried, embedded or built-in components. The insulating-material layer surrounding the component is typically part of the basic structure of a circuit-board or module structure, which forms support for the innermost conductor layers of the circuit-board or module.

The invention further relates to an electronic module. In particular, the invention relates to an electronic module, which includes at least one component embedded in an insulating layer. The electronic module can be a module like a circuit board, which includes several components, which are connected to each other electrically through conducting structures manufactured in the module. The components can be passive components, microcircuits, semiconductor components, or any other types of components.

BACKGROUND OF THE INVENTION

Many methods are known by means of which electronic modules or circuit-board structures containing components can be manufactured. Document U.S. Pat. No. 5,936,847 discloses, for example, a circuit module construction for mounting and interconnecting electronic components to substrates, which is applicable to mounting a wide variety of electronic components and conductors, including inverted or 'flip chip' mounted integrated circuits. The components are mounted to the substrate with a sandwiched non-conductive polymer layer which acts as the bonding agent and underfill. The substrate and underfill have apertures aligned with signal traces on the substrate and the contacts of the component and conductive polymer is injected through the apertures to fill the area between the substrate contacts and the component contacts, to secure good electrical connection. In one embodiment the non-conductive polymer is printed on the contact side of the substrate with gaps for the contacts. In another embodiment B-staged non-conductive polymer is coated on the non-contact side of the substrate, prior to forming contact apertures and mounting of components. Conductive polymer is then injected in the apertures to make the electrical connections, and the assembly is cured. No coating or pre-treatment of the components is needed.

Additionally, document U.S. Pat. No. 6,038,133 teaches a circuit component built-in module including an insulating substrate formed of a mixture comprising 70 wt % to 95 wt % of an inorganic filler and a thermosetting resin, a plurality of wiring patterns formed on at least a principal plane of the insulating substrate, a circuit component arranged in an internal portion of the insulating substrate and electrically connected to the wiring patterns, and an inner via formed in the insulating substrate for electrically connecting the plurality of wiring patterns. Thus, a highly reliable circuit component built-in module having high-density circuit components can be obtained.

Document U.S. Pat. No. 6,350,633 further discloses a semiconductor chip assembly including a semiconductor chip attached to a support circuit. The support circuit includes an insulative base, a conductive trace and a through-hole between its top and bottom surfaces. The through-hole includes a top sidewall portion adjacent to the top surface and a bottom sidewall portion adjacent to the bottom surface. The conductive trace includes a pillar at the top surface and a routing line at the bottom sidewall portion. An electroplated contact terminal on the pillar extends above the base, and an electroplated connection joint in the through-hole contacts the routing line and the pad. Preferably, the connection joint is the only metal in the through-hole. A method of manufacturing the assembly includes simultaneously electroplating the contact terminal and the connection joint.

Document US 2002/0117743 A1 furthermore describes a component built-in module including a core layer formed of an electric insulating material, and an electric insulating layer and a plurality of wiring patterns, which are formed on at least one surface of the core layer. The electric insulating material of the core layer is formed of a mixture including at least an inorganic filler and a thermosetting resin. At least one or more of active components and/or passive components are contained in an internal portion of the core layer. The core layer has a plurality of wiring patterns and a plurality of inner vias formed of a conductive resin. The electric insulating material formed of the mixture including at least an inorganic filler and a thermosetting resin of the core layer has a modulus of elasticity at room temperature in the range from 0.6 GPa to 10 GPa. Thus, it is possible to provide a thermal conductive component built-in module capable of filling the inorganic filler with high density; burying the active component such as a semiconductor etc. and the passive component such as a chip resistor, a chip capacitor, etc. in the internal portion of the substrate; and simply producing a multilayer wiring structure.

Document U.S. Pat. No. 8,240,033 teaches a method for manufacturing a circuit-board structure. According to the method, a conductor pattern is made, and contact openings are made in it for a component's electrical contacts. After this, the component is attached relative to the conductor pattern, in such a way that the contact areas or contact bumps of the component lie next to the contact openings. After this, an electrically conductive material is introduced to the contact openings, in order to form electrical contacts between the conductor pattern and the component.

Additionally, document U.S. Pat. No. 8,581,109 discloses a method for manufacturing a circuit-board structure. In the method, a conductor layer is made, which comprises a conductor foil and a conductor pattern on the surface of the conductor foil. A component is attached to the conductor layer and at least some conductor material of the conductor layer is removed from outside the conductor pattern.

Document U.S. Pat. No. 5,407,864 describes a process of manufacturing a semiconductor chip that has a connecting pad and is connected to a front side of a circuit board that has a conductive trace connected to a through-hole. An insulating adhesive layer, which has a hole corresponding to the pad, is interposed between the chip and the board so that the pad, the hole in the insulating layer and the through-hole in the board are aligned. A conductive material is applied into the through-hole from the back side of the board so as to fill the through-hole and connect the pad to the trace. The conductive material may be applied using a sputtering method, a screening method, an electroplating method or an evaporating method. The back side of the board is polished to remove conductive material which may have been applied on the back side of the board outside the through-hole.

SUMMARY OF THE INVENTION

An object of certain embodiments of the present invention is to provide a method for fabrication of an electronic module with at least one component embedded in an insulating layer. A further object of certain embodiments of the present invention is to provide an electronic module. In particular, an object of certain embodiments of the invention is to provide an electronic module which includes at least one component embedded in an insulating layer. A further object of certain embodiments of the invention is to provide an electronic module which includes a plurality of interconnected components embedded in an insulating layer.

These and other objects are achieved by the embodiments of the present invention, as hereinafter described and claimed. According to an aspect, the invention concerns a method of manufacturing an electronic module, the method comprising:

providing a resist layer having a first surface and a second surface and a thickness between the first surface and the second surface, providing at least one opening through the resist layer, providing insulating material on the second surface of the resist layer and at least one component embedded in the insulating material, providing at least one conductive pattern in the at least one opening such that the at least one conductive pattern has a first surface and a second surface, wherein the second surface faces the insulating material and the first surface faces away from the insulating material, and that a distance between the first surface of the resist layer and the second surface of the at least one conductive pattern is less or greater than the thickness of the resist layer, and providing connection elements between the at least one conductive pattern and the at least one component.

According to another aspect, the object of the embodiments can be also achieved by a method for fabrication of an electronic module with at least one component embedded in an insulating layer, the method comprising the steps of:

a) arranging a release layer on a first surface of a conductive foil, b) arranging a first resist layer with pattern and/or via openings on top of the release layer and growing conductor material, the thickness of the first resist layer being greater or less than the thickness of the conductor material being grown, c) arranging an adhesive on top of or on top of a part of the resist layer and the conductor material being grown or on a contacting surface of at least one component, which has contact zones, d) placing the at least one component in such a way that the contacting surface faces towards a second surface of the resist layer and the positions of the contact zones coincide with the positions of the via openings, e) arranging an insulating layer in such a way that the at least one component is embedded in the insulating layer, f) removing the conductive foil and the release layer, and g) removing material from the via openings, thus forming via holes, and growing of conductor material in the via holes.

According to an embodiment, an additional polymeric layer is made between the first resist layer and the adhesive.

According to another embodiment, a second resist layer with pattern and via openings is arranged after step b) in such a way that a first surface of the second resist layer faces towards the first resist layer and conductor material is grown, the thickness of the second resist layer being greater or less than the thickness of the conductor material being grown. According to certain embodiments, after arranging a second resist layer an additional polymeric layer may be made between a second surface of the second resist layer and the adhesive.

According to an embodiment, the conductive layer and/or an lower conductive surface of the electronic module is removed, thus exposing conductive patterns after growing of conductor material in the via holes.

According to an aspect of the invention, there is provided an electronic module comprising:

a first insulating material having a first surface and a second surface and a thickness between the first surface and the second surface, at least one opening through the first insulating material, a second insulating material on the second surface of the first insulating material, at least one component embedded in the second insulating material, at least one conductive pattern in the at least one opening, the at least one conductive pattern having a first surface and a second surface, wherein the second surface faces the second insulating material and the first surface faces away from the second insulating material and a distance between the first surface of the first insulating material and the second surface of the at least one conductive pattern is less than the thickness of the first insulating material or greater than the thickness of the first insulating material, and connection elements between the at least one conductive pattern and the at least one component.

In an embodiment, the connection elements comprise conductor material deposited in a via hole in the insulating material. In another embodiment, the second insulating material on the second surface comprises between the first insulating material and the at least one component an insulating layer such as an adhesive layer, a polymeric layer or any other material than the second insulating material. The polymeric layer is arranged between the second surface of the first insulating material, the adhesive and/or the surface of the insulating layer facing towards the first insulating material.

In an embodiment, a distance between the first surface of the first insulating material and the first surface of the at least one conductive pattern is greater than zero.

In an embodiment, the aspect ratio of at least one via extending from the second surface of the at least one conductive pattern to a contacting surface of at least one contact zone of the component is less than 2.0, less than 1.0, less than 0.75, less than 0.5, less than 0.4, or less than 0.3. In the present document, the aspect ratio is defined as ratio of the height to the diameter of the via (=h/d).

In an embodiment, at least one conductive pattern is arranged on top of the second insulating material.

In an embodiment, the at least one component is a passive component, a microcircuit, a semiconductor component, or any other type of component.

Considerable advantages are obtained by means of the embodiments of the present invention. An electronic module with at least one component embedded in an insulating layer can be manufactured according to certain embodiments of the invention. By means of the invention it is possible to build a module with a high contact density. Layers of the electronic module are very thin, thus creating a thin module. The fabrication method will permit electrical contacts to be made using the via method. Contacts can be, for example, made with the aid of a chemical or electrochemical growing method, in which case it will be possible to achieve excellent electrical properties for the contact between the conductor pattern and the component. It is also possible to grow a thin layer by a chemical method first and continue the growing using a cheaper electrochemical method. The cost-effective fabrication method improves the quality of the electronic module and provides a better yield.

The alignment of the via openings in relation to the pattern can be further inspected prior to attaching the components or continuing the manufacturing process. Placing of expensive components by gluing them to an undesired position can be therefore avoided. Further, the pattern is done and can be inspected prior to component assembly, and thus can one avoid assembling a component to a defected pattern.

BRIEF DESCRIPTION OF THE DRAWINGS

For a more complete understanding of particular embodiments of the present invention and their advantages, reference is now made to the following descriptions, taken in conjunction with the accompanying drawings. In the drawings.

DETAILED DESCRIPTION OF EMBODIMENTS OF THE INVENTION

Figure 1:
FIG. 1 illustrates a schematic view of a first fabrication step of an electronic module according to a first embodiment.
Figure 11:
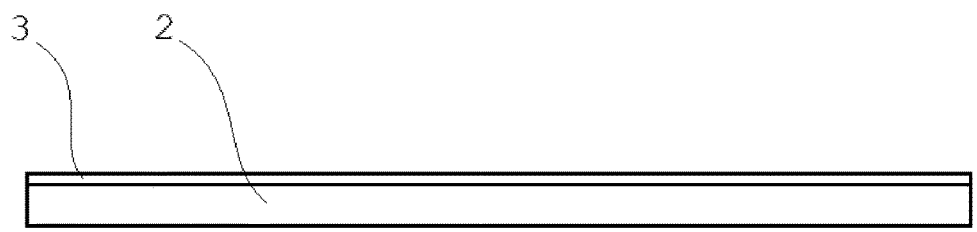
FIG. 11 illustrates a schematic view of a first fabrication step of an electronic module according to a second embodiment.
Figure 21:
FIG. 21 illustrates a schematic view of a first fabrication step of an electronic module according to a third embodiment.

In FIG. 1, FIG. 11 and FIG. 21 a schematic view of a first fabrication step of an electronic module 1 according to a first, second or third embodiment of the present invention is shown. In this first step a conductive release layer 3 is arranged on top of a conductive foil 2. The conductive foil 2 may be for example made from copper. The conductive foil 2 and the release layer 3 form a carrier for the steps of the following fabrication process of an electronic module 1. The conductivity property of the conductive release layer 3 and the conductive foil 2 is required to conduct the current required for electrolytic growing to the area in which the conductor material is being grown at a later stage of the fabrication method.

Figure 2:
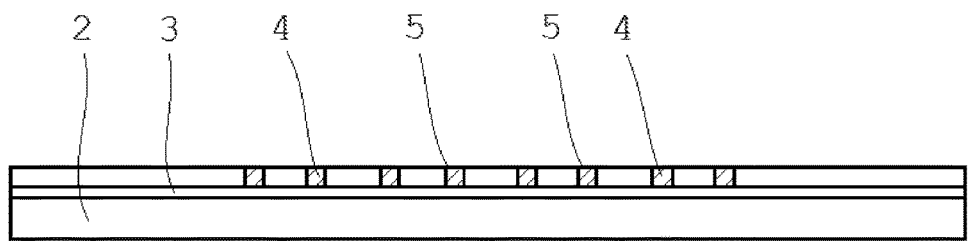
FIG. 2 illustrates a schematic view of a second fabrication step of an electronic module according to a first embodiment.
Figure 12:
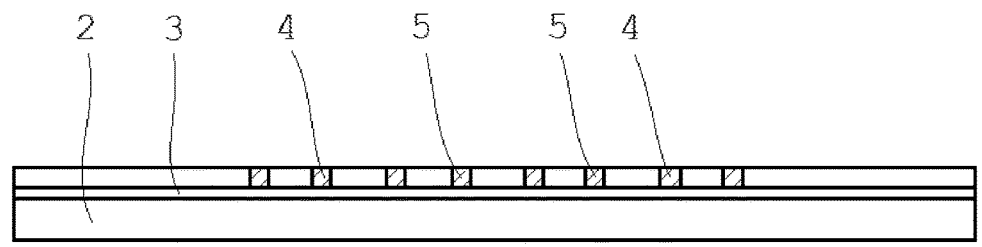
FIG. 12 illustrates a schematic view of a second fabrication step of an electronic module according to a second embodiment.

In FIG. 2 and FIG. 12 a schematic view of a second fabrication step of an electronic module 1 according to a first or second embodiment of the present invention is shown. A first resist layer 4, which forms via openings 5, is arranged on top of the release layer 3. Then growing of conductor material, for example copper, aluminum, zinc, nickel, gold, titanium or iron, or a combination of two or more of the afore-mentioned metals, takes place in such a way that the thickness of the first resist layer 4 is less or greater than the thickness of the conductor material being grown. Electrolytically growing a layer of conductor material takes place in the areas from which resist has been removed or in which resist has not been applied.

Figure 3:
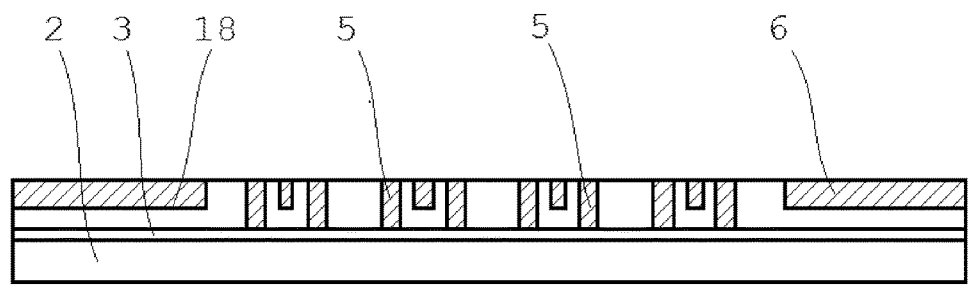
FIG. 3 illustrates a schematic view of a third fabrication step of an electronic module according to a first embodiment.

In FIG. 3 a schematic view of a third fabrication step of an electronic module 1 according to a first embodiment of the present invention is shown. A second resist layer 6, which forms patterns and via openings 5, is arranged in such a way that a first surface 18 of the second resist layer 6 faces towards the first resist layer 4. The via openings 5 of the second resist layer 6 are arranged such that their position coincides with the position of the via openings 5 of the first resist layer 4. Thus, the via openings 5 of the first and second resist layer 4, 6 form united via openings 5. Then growing of conductor material takes place in such a way that the thickness of the second resist layer 6 is less or greater than the thickness of the conductor material being grown. The conductor material does not necessarily need to be the same as used in the second manufacturing step but can also be one of the other alternatives or combinations. The material in the via openings 5 will be removed, for example by plasma etching or laser ablation, at a later stage of the fabrication method. The rest of the second resist layer 6 will be permanently included in the electronic module 1. One via opening 5 is made for each contact area that participates in forming an electrical contact. The surface area of the via openings 5 being made can be approximately as large as the surface areas of the corresponding contact zones 10. The surface area of the via openings 5 can, of course, also be selected to be smaller, or, in some embodiments, slightly larger than the surface area of the corresponding contact zones 10. The alignment of the united via openings 5 can be further examined prior to attaching the components 8, or continuing the manufacturing process. The inspection of the alignment of the united via openings 5 can for example take place with a 2-D or 3-D measurement system or x-ray measurement system for measuring the position of the united via openings 5. With the help of an electronic computing device a measurement signal or measurement value can then be checked against a respective reference signal or respective reference value and the measurement signal or measurement value can be classified as "OK" or "not OK" according to defined tolerance values.

Figure 4:
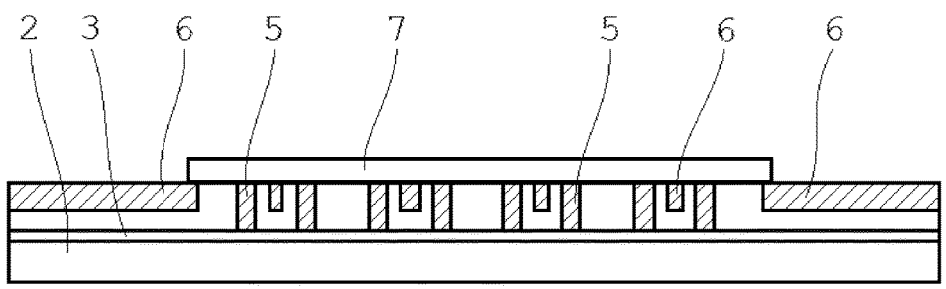
FIG. 4 illustrates a schematic view of a fourth fabrication step of an electronic module according to a first embodiment.

In FIG. 4 a schematic view of a fourth fabrication step of an electronic module 1 according to a first embodiment of the present invention is shown. On top of the second resist layer 6 and the grown conductor material an adhesive layer 7 is applied. The adhesive can also be spread in stages and in layers. The adhesive 7 can be applied locally only in the area of the component or globally over the entire surface. According to certain embodiments, a separate adhesive is not needed and the component can be directly attached to the conductor material. In this case, all the empty space between the component and the conductor material would be filled when making the insulative layer 11 at a later stage. In some certain embodiments, it may be preferable to spread adhesive so liberally on the second surface 19 of the second resist layer 6 and the conductor material being grown that the adhesive fills the entire space remaining between the components 8 and the second resist layer 6. The term adhesive refers to a material, by means of which components 8 can be attached to the resist layer 6 and the conductor material. The adhesive 7 used in the embodiments may be, for example, an epoxy. The thickness of the adhesive layer 7 is, for example, in the range between 2 μm and 20 μm, such as between 5 μm and 15 μm. The adhesive 7 used is selected in such a way that the adhesive used will have sufficient adhesion to the resist layer 6 and the conductor material and the components 8. One beneficial property of the adhesive 7 is a suitable coefficient of thermal expansion, so that the thermal expansion of the adhesive will not differ too greatly from the thermal expansion of the surrounding material during the process. According to certain embodiments, the adhesive selected has a short hardening time, such as a few seconds at most. According to another certain embodiment, the adhesive 7 hardens at least partly within this time so that the adhesive 7 will be able to hold the component 8 in place. The final hardening can take clearly more time and the final hardening can even be planned to take place in connection with later process stages. Typically the adhesive material is an electrically insulating material. According to certain embodiments, the electrical conductivity of the adhesive 7 is of the same order as the electrical conductivity of the insulating material of the insulating layer 11. According to certain other embodiments, the adhesive 7 used may have other dielectric properties such as breakdown strength or dielectric constant different to the insulating layer 11 made at a later stage.

Figure 5:
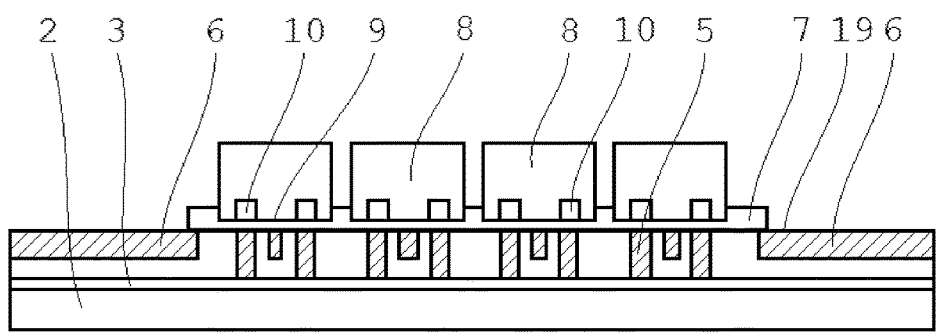
FIG. 5 illustrates a schematic view of a fifth fabrication step of an electronic module according to a first embodiment.

In FIG. 5 a schematic view of a fifth fabrication step of an electronic module 1 according to a first embodiment of the present invention is shown. Four components 8 such as passive components, microcircuits, semiconductor components, or any other types of components, which have a contacting surface 9, which have contact zones 10, are placed on the adhesive layer and attached, for example by gluing, in such a way that the contacting surfaces 9 of the four components 8 face towards a second surface 19 of the second resist layer 6 and the positions of the contact zones 10 of the components coincide with the positions of the united via openings 5. The components 8 can have contact zones 10 on one or both sides. The contact zones 10 of the components 8 can be, for example, flat areas on the contacting surface 9 or more usually contact protrusions, such as contact bumps, protruding from the contacting surface 9 of the component 8. Contact zones 10 can be also on the bottom of recesses in the surface of the component 8. There are generally at least two contact zones 10 or protrusions in the component 8. In complex microcircuits, there can be very many contact zones 10. The attachment of the components 8 can be performed using several techniques and in one or more stages. Components 8 may be for example attached on the adhesive layer 7 using a suitable flip-chip mounting apparatus. After this, the adhesive 7 is allowed to harden (at least partly), or the adhesive is actively hardened (at least partly), so that the component is fixedly attached with the aid of the adhesive 7 to the electronic module 1.

Figure 6:
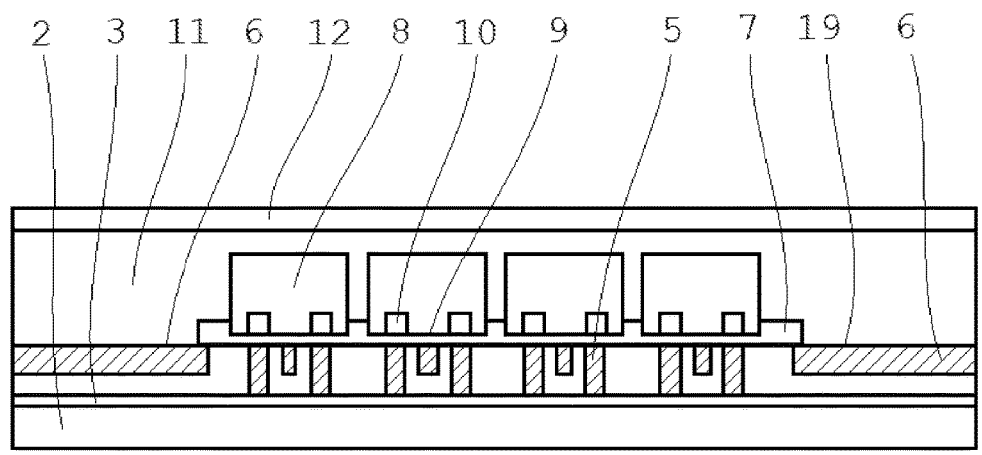
FIG. 6 illustrates a schematic view of a sixth fabrication step of an electronic module according to a first embodiment.

In FIG. 6 a schematic view of a sixth fabrication step of an electronic module 1 according to a first embodiment of the present invention is shown. An insulating layer 11 is made in such a way that the four components 8 are embedded in the insulating layer 11. Examples of materials suitable for the insulating layer 11 are polyamide, FR1, FR5, aramid, polytetrafluorethylene, Teflon®, LCP (liquid crystal polymer) and a prehardened binder layer, i.e. prepreg. According to certain embodiments, the structure shown in FIG. 6 is further pressed with the aid of heat to become a unified module, thus achieving a mechanically durable construction. According to certain other embodiments, a molding process is used to become a unified module. According to certain embodiments, on top of the insulating layer 11 a conductive layer 12, usually copper or other conductive material, is arranged.

Figure 7:
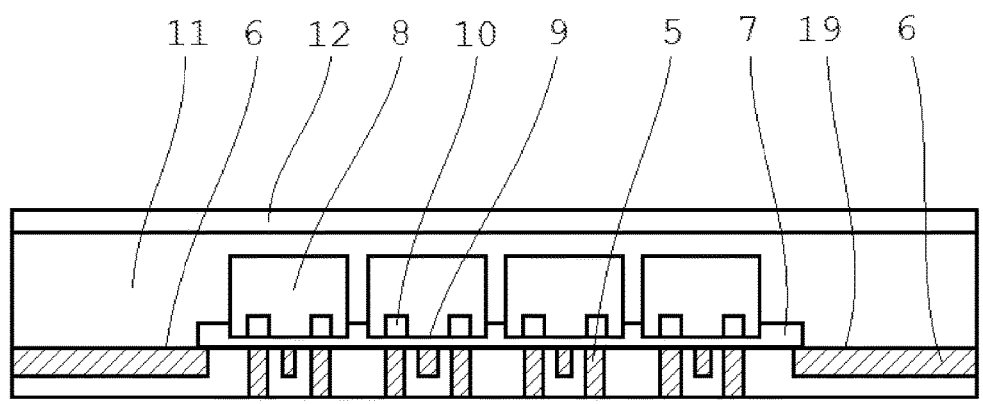
FIG. 7 illustrates a schematic view of a seventh fabrication step of an electronic module according to a first embodiment.

In FIG. 7 a schematic view of a seventh fabrication step of an electronic module 1 according to a first embodiment of the present invention is shown. The conductive foil 2 and the release layer 3 are removed. In an embodiment, wherein the material of the release layer 3 is selected such that it at least partially loses its adhesion or cohesion during the previous heat treatment step, the metal foil 2 can be simply removed with the aid of such heat treatment. Of course, any other applicable method and technology can be used. After the removal, there is substantially no material of the release layer 3 left in the electronic module 1. Additionally, if there are some remains of the material of the release layer 3, it can be easily removed by an additional cleaning step.

Figure 8:
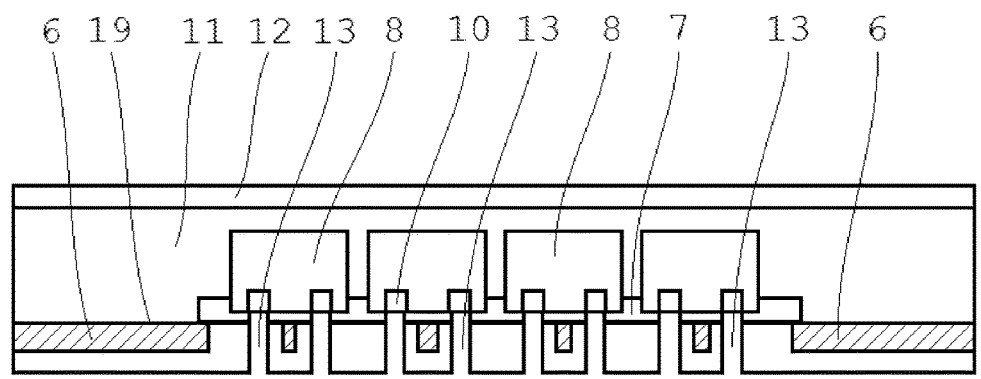
FIG. 8 illustrates a schematic view of an eighth fabrication step of an electronic module according to a first embodiment.

In FIG. 8 a schematic view of an eighth fabrication step of an electronic module 1 according to a first embodiment of the present invention is shown. The material in the via openings 5 of the electronic module 1 is removed such that conductor material is not removed, for example by plasma etching or a low power laser or a combination thereof. By means of removing the material of the first and second resist layer 4, 6 and the adhesive 7 from the united via openings 5 via holes 13 are formed. This usually also cleans the contact zones 10 of the component 8 but it is also possible to use a separate cleaning process to clean the contact zones 10. The via holes 13 extend from the lower conductor layer 14 through the conductor material and the adhesive layer 7 to the contact zones 10 of the components 8. After cleaning it is further possible to check the alignment of the component 8, as the contact zones 10 of a correctly aligned component 8 will appear through the via holes 13. According to certain embodiments, the inspection of the alignment of the contact zones 10 can for example take place with a 2-D or 3-D measurement system or a x-ray measurement system for measuring the position of the contact zones 10. With the help of an electronic computing device a measurement signal or measurement value can then be checked against a respective reference signal or respective reference value and the measurement signal or measurement value can be classified as "OK" or "not OK" according to defined tolerance values.

Figure 9:
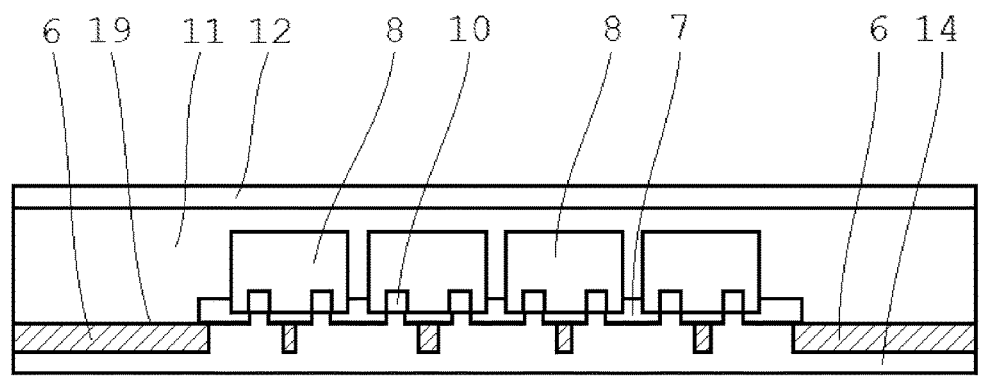
FIG. 9 illustrates a schematic view of a ninth fabrication step of an electronic module according to a first embodiment.

In FIG. 9 a schematic view of a ninth fabrication step of an electronic module 1 according to a first embodiment of the present invention is shown. The via holes 13 are filled with a conductor material, for example, a metal, metal alloy, a conductive paste or conductive polymer, for example, a conductive adhesive. It is also possible to fill the via holes 13 with layers of different conductor materials. The best electrical contact is achieved using an embodiment, in which the via holes 13 are filled by growing metal into the via holes 13 and on top of the contact zones 10 of the components 8. It will then be possible to create in the via holes 13 a via structure that is of substantially pure metal. It will then also be possible to create in the via holes 13 a via structure, which is in metallurgical contact with the conductor material of the contact zones 10 of the components 8. Metallization of the via holes 13 and growing of conductor material, e.g. copper, in the via holes 13 takes place. In other words, a conductor material is introduced to the via holes 13, in order to form electrical contacts between the contact zones 10 of the components 8 and the lower conductive surface 14. High-quality electrical contacts can be made, for example, by forming a metallurgical connection by growing the conductor material chemically or by an electrochemical method. One alternative is to grow a thin layer by a chemical method and continue the growing using a cheaper electrochemical method. Of course, any other suitable method can be used instead or in addition to the aforementioned methods. Thus, the possible methods include for example electrochemical plating, chemical deposition methods, sputtering and vaporization. The contact structure can include one, two or several layers of one, two or several metals. Possible metals include, but are not limited to, aluminum, copper, zinc, nickel, gold, titanium and iron, for instance. Also conducting adhesive, conductive paste or solder can be used, for instance.

Figure 10:
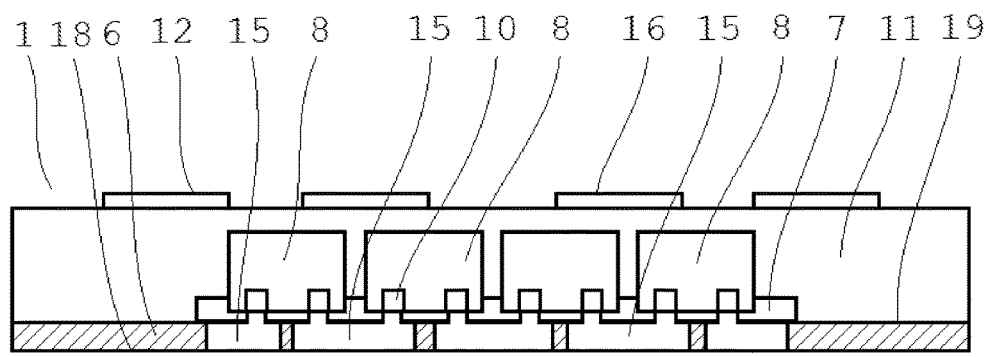
FIG. 10 illustrates a schematic view of a tenth fabrication step of an electronic module according to a first embodiment.

In FIG. 10 a schematic view of a tenth fabrication step of an electronic module 1 according to a first embodiment of the present invention is shown. In this last fabrication step of the electronic module 1 the conductive layer 12 and a lower conductive surface 14 of the electronic module 1 are removed, thus exposing the conductive patterns 15, 16. In an embodiment, the aspect ratio of at least one via extending from the second surface 21 of the at least one conductive pattern 15 to the contacting surface 9 of the at least one contact zone 10 of the component 8 is less than 2.0, less than 1.0, less than 0.75, less than 0.5, less than 0.4, or less than 0.3. The adhesive layer 7 reinforces the mechanical connection between the components 8 and the conductive patterns 15, thus achieving a mechanically more durable construction.

Figure 13:
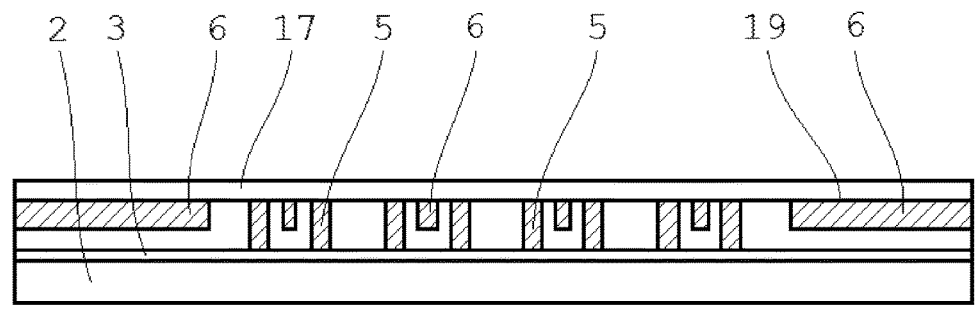
FIG. 13 illustrates a schematic view of a third fabrication step of an electronic module according to a second embodiment.

In FIG. 13 a schematic view of a third fabrication step of an electronic module 1 according to a second embodiment of the present invention is shown. Contrary to the third fabrication step of the aforementioned electronic module 1 according to the first embodiment (cf. FIG. 3) an additional polymeric layer 17 is arranged on top of the second surface 19 of the second resist layer 6. This arrangement will lead to an additional layer between the second surface 19 of the second resist layer 6 and the adhesive layer 7 and insulating layer 11 of the electronic module 1. According to a certain embodiment, the polymeric layer 17 is applied as a single layer or as multi-layers. According to another certain embodiment, the polymeric layer 17 is a film that is attached using an additional adhesive layer. The additional polymeric layer 17 is beneficial in embodiments wherein it is important to avoid any voids in the insulation between conductive patterns 15 and the component 8. Such voids can occur for example if there are air bubbles in the adhesive forming the adhesive layer 7. Such air bubbles affect dielectric properties of the insulation between conductive patterns 15 and the component 8, which is to be avoided at least in some applications. The additional polymeric layer 17 can also be used to adjust or set the dielectric properties of the insulating layer between the component and the conductor patterns. The additional polymeric layer 17 can also be used to adjust or set the distance between the component and the conductor patterns. The additional polymeric layer 17 can be made of polyimide or epoxy, for instance.

Figure 14:
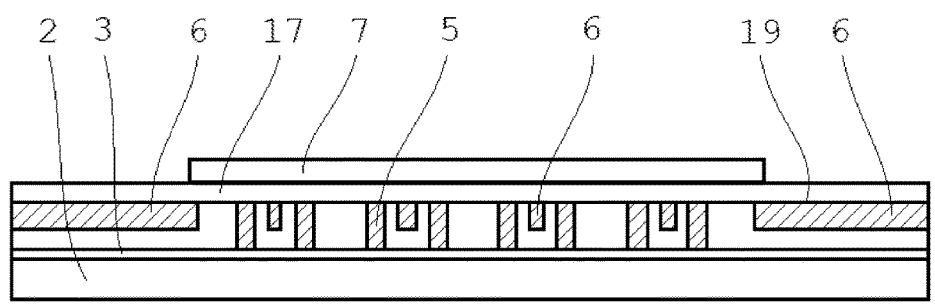
FIG. 14 illustrates a schematic view of a fourth fabrication step of an electronic module according to a second embodiment.

In FIG. 14 a schematic view of a fourth fabrication step of an electronic module 1 according to a second embodiment of the present invention is shown. An adhesive layer 7 is applied on top of the additional polymeric layer 17. The thickness of the adhesive layer 7 is, for example, in the range between 2 μm and 20 μm, such as between 5 μm and 15 μm.

Figure 15:
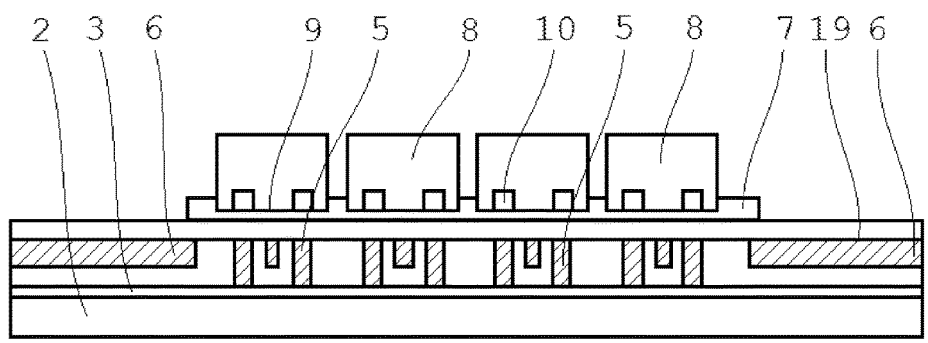
FIG. 15 illustrates a schematic view of a fifth fabrication step of an electronic module according to a second embodiment.

In FIG. 15 a schematic view of a fifth fabrication step of an electronic module 1 according to a second embodiment of the present invention is shown. Four components 8, which have contacting surfaces 9, which have contact zones 10, are placed on the adhesive layer 7 in such a way that the contacting surfaces 9 of the four components 8 face towards the second surface 19 of the second resist layer 6 and the positions of the contact zones 10 of the components coincide with the positions of the united via openings 5. The components 8 being attached can be, for example, an integrated circuit, such as a memory chip, a processor, or an ASIC. The component 8 being attached can also be, for example, a MEMS, LED, or a passive component. The component 8 being attached can be cased or uncased and can comprise contact bumps, recesses or flat surfaces in its contact zones 10. Contact zones 10 can be arranged on one or more sides of the component 8.

Figure 16:
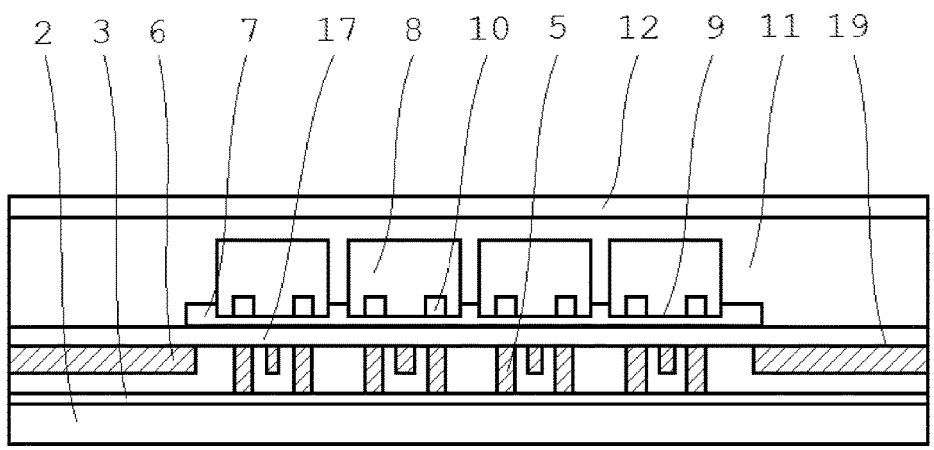
FIG. 16 illustrates a schematic view of a sixth fabrication step of an electronic module according to a second embodiment.

In FIG. 16 a schematic view of a sixth fabrication step of an electronic module 1 according to a second embodiment of the present invention is shown. An insulating layer 11 is made in such a way that the four components 8 are embedded in the insulating layer 11. According to certain embodiments, on top of the insulating layer 11 a conductive layer 12, such as copper, is arranged.

Figure 17:
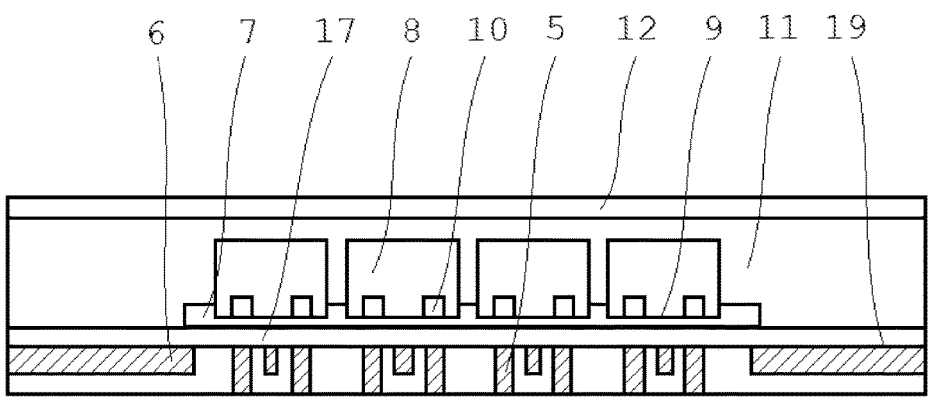
FIG. 17 illustrates a schematic view of a seventh fabrication step of an electronic module according to a second embodiment.

In FIG. 17 a schematic view of a seventh fabrication step of an electronic module 1 according to a second embodiment of the present invention is shown. The conductive foil 2 and the release layer 3 are removed.

Figure 18:
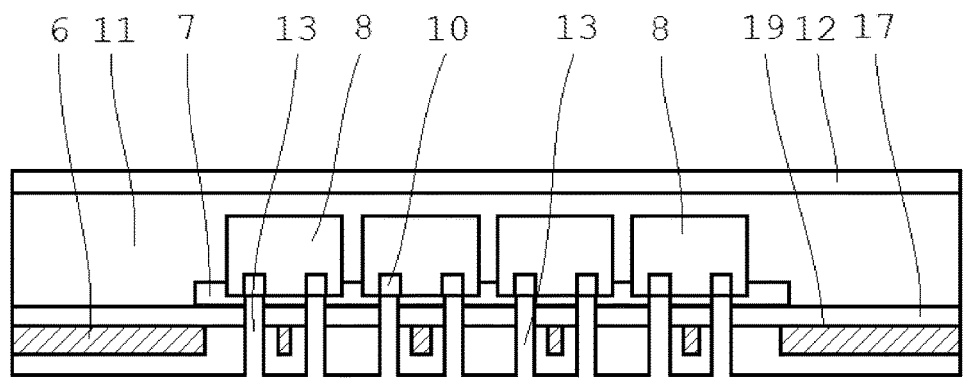
FIG. 18 illustrates a schematic view of an eighth fabrication step of an electronic module according to a second embodiment.

In FIG. 18 a schematic view of an eighth fabrication step of an electronic module 1 according to a second embodiment of the present invention is shown. The material in the via openings 5 of the electronic module 1 is removed, for example by plasma etching or a low power laser or a combination thereof. By means of removing the material of the first and second resist layer 4, 6, the polymeric layer 17 and adhesive 7 from the united via openings 5 via holes 13 are formed. The via holes 13 extend from the lower conductor layer 14 through the conductor material, the polymeric layer 17 and the adhesive layer 7 to the contact zones 10 of the components 8.

Figure 19:
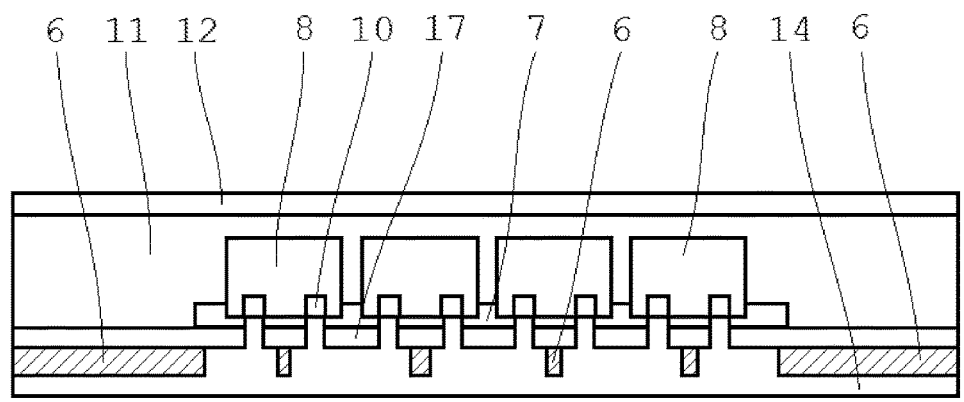
FIG. 19 illustrates a schematic view of a ninth fabrication step of an electronic module according to a second embodiment.

In FIG. 19 a schematic view of a ninth fabrication step of an electronic module 1 according to a second embodiment of the present invention is shown. Metallization of the via holes 13 and growing of conductor material, e.g. copper, in the via holes 13 takes place in this step.

Figure 20:
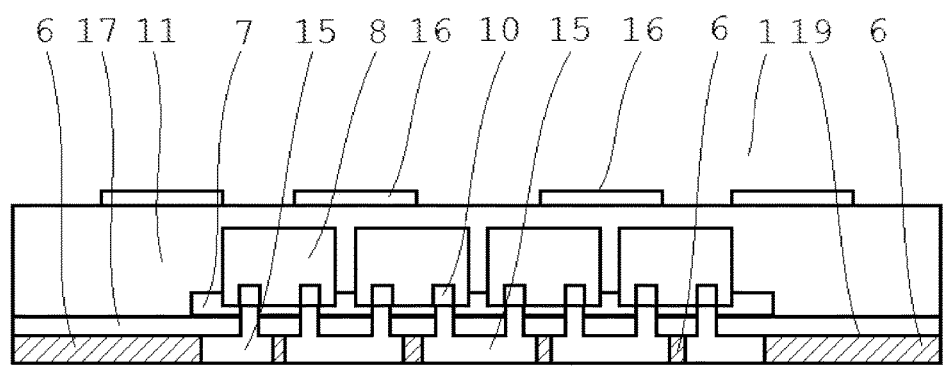
FIG. 20 illustrates a schematic view of a tenth fabrication step of an electronic module according to a second embodiment.

In FIG. 20 a schematic view of a tenth fabrication step of an electronic module according to a second embodiment of the present invention is shown. In this last fabrication step of the electronic module 1 the conductive layer 12 and a lower conductive surface 14 of the electronic module 1 are removed, thus exposing conductive patterns 15, 16. In an embodiment, the aspect ratio of at least one via extending from the second surface 21 of the at least one conductive pattern 15 to the contacting surface 9 of the at least one contact zone 10 of the component 8 is less than 2.0, less than 1.0, less than 0.75, less than 0.5, less than 0.4, or less than 0.3.

Figure 22:
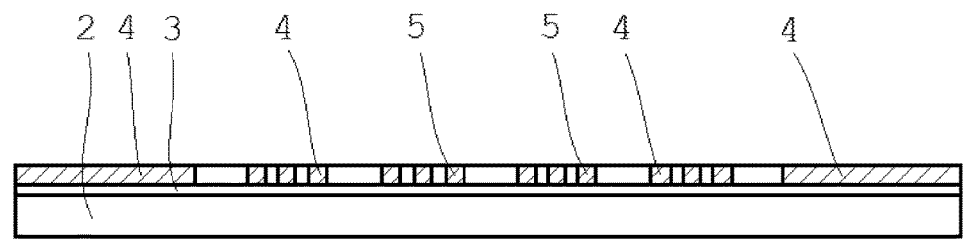
FIG. 22 illustrates a schematic view of a second fabrication step of an electronic module according to a third embodiment.

In FIG. 22 a schematic view of a second fabrication step of an electronic module according to a third embodiment of the present invention is shown. A resist layer 4, which forms via openings 5 and a pattern, is arranged on top of the release layer 3. Then growing of conductor material, for example copper, aluminum, zinc, nickel, gold, titanium or iron, or a combination of two or more of the afore-mentioned metals, takes place in such a way that the thickness of the resist layer 4 is less or greater than the thickness of the conductor material being grown. Electrolytically growing a layer of conductor material takes place in the areas from which resist has been removed or in which resist has not been applied. The alignment of the via openings 5 can be further inspected prior to attaching the components 8, or continuing the manufacturing process. The examination of the alignment of the via openings 5 can for example take place with a 2-D or 3-D measurement system or a x-ray measurement system for measuring the position of the via openings 5. With the help of an electronic computing device a measurement signal or measurement value can be checked against a respective reference signal or respective reference value and the measurement signal or measurement value can be classified as "OK" or "not OK" according to defined tolerance values.

Figure 23:
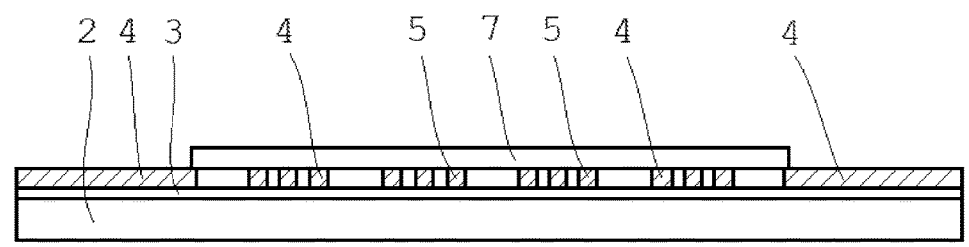
FIG. 23 illustrates a schematic view of a third fabrication step of an electronic module according to a third embodiment.

In FIG. 23 a schematic view of a third fabrication step of an electronic module according to a third embodiment of the present invention is shown. On top of the resist layer 4 and the grown conductor material an adhesive layer 7 is applied. The adhesive 7 used in the embodiments may be, for example, an epoxy. The adhesive 7 used is selected in such a way that the adhesive used will have sufficient adhesion to the resist layer 4 and the conductor material and the components 8. The electrical conductivity of the adhesive 7 is preferably of the same order as the electrical conductivity of the insulating material of the insulating layer 11.

Figure 24:
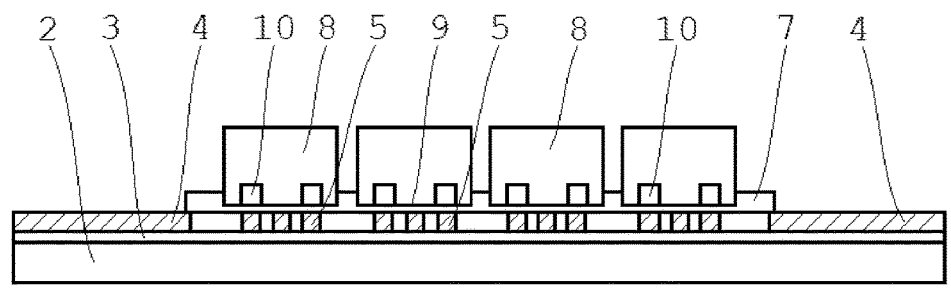
FIG. 24 illustrates a schematic view of a fourth fabrication step of an electronic module according to a third embodiment.

In FIG. 24 a schematic view of a fourth fabrication step of an electronic module according to a third embodiment of the present invention is shown. Four components 8, which have contacting surfaces 9, which have contact zones 10, are placed on the adhesive layer 7 in such a way that the contacting surfaces 9 of the four components 8 face towards the second surface 19 of the resist layer 4 and the positions of the contact zones 10 of the components coincide with the positions of the via openings 5. The components 8 being attached can be, for example, an integrated circuit, such as a memory chip, a processor, or an ASIC. The component 8 being attached can also be, for example, a MEMS, LED, or a passive component. The component 8 being attached can be cased or uncased and can comprise contact bumps, recesses or flat surfaces in its contact zones 10. Contact zones 10 can be arranged on one or more sides of the component 8.

Figure 25:
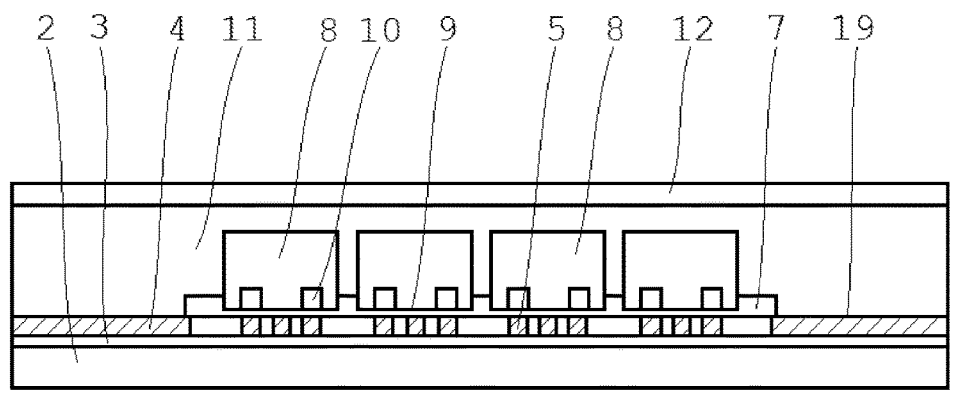
FIG. 25 illustrates a schematic view of a fifth fabrication step of an electronic module according to a third embodiment.

In FIG. 25 a schematic view of a fifth fabrication step of an electronic module according to a third embodiment of the present invention is shown. An insulating layer 11 is made in such a way that the four components 8 are embedded in the insulating layer 11. According to certain embodiments, on top of the insulating layer 11 a conductive layer 12, such as copper, is arranged.

Figure 26:
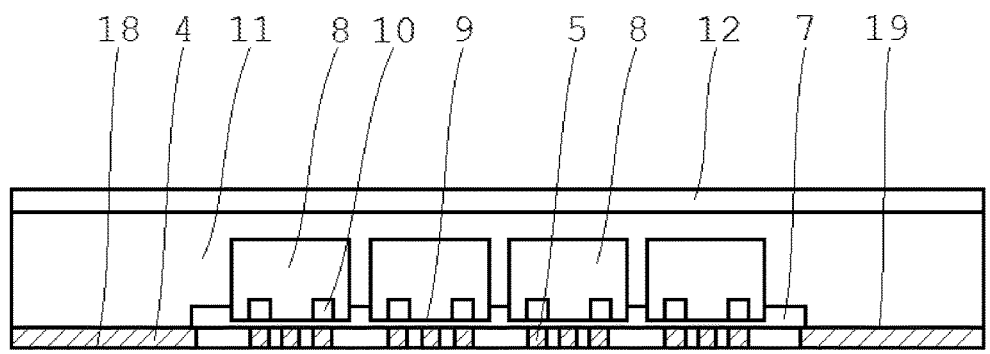
FIG. 26 illustrates a schematic view of a sixth fabrication step of an electronic module according to a third embodiment.

In FIG. 26 a schematic view of a sixth fabrication step of an electronic module according to a third embodiment of the present invention is shown. The conductive metal foil 2 and the release layer 3 are removed.

Figure 27:
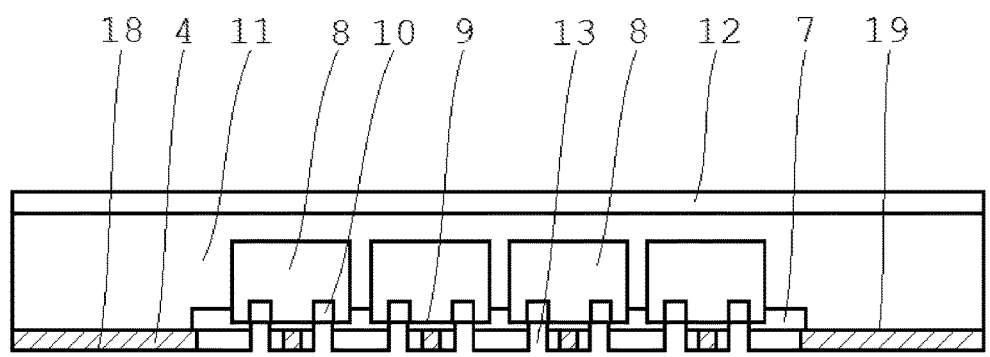
FIG. 27 illustrates a schematic view of a seventh fabrication step of an electronic module according to a third embodiment.

In FIG. 27 a schematic view of a seventh fabrication step of an electronic module according to a third embodiment of the present invention is shown. The material in the via openings 5 of the electronic module 1 is removed, for example by plasma etching or a low power laser or a combination thereof. By means of removing the material of the resist layer 4 and adhesive 7 from the via openings 5 via holes 13 are formed.

Figure 28:
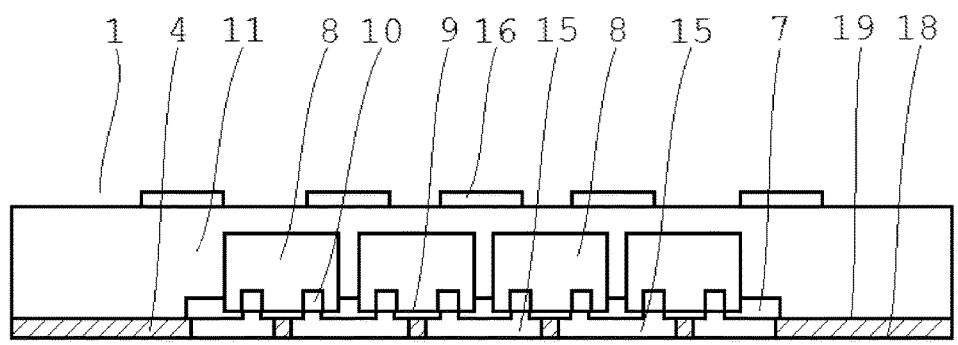
FIG. 28 illustrates a schematic view of an eighth fabrication step of an electronic module according to a third embodiment.

In FIG. 28 a schematic view of an eighth fabrication step of an electronic module according to a third embodiment of the present invention is shown. Metallization of the via holes 13 and growing of conductor material, e.g. copper, in the via holes 13 takes place in this step. In this last fabrication step of the electronic module 1 the conductive layer 12 is further patterned to form conductive patterns 16. In an embodiment, the aspect ratio of at least one via extending from the second surface 21 of the at least one conductive pattern 15 to the contacting surface 9 of the at least one contact zone 10 of the component 8 is less than 2.0, less than 1.0, less than 0.75, less than 0.5, less than 0.4, or less than 0.3. The adhesive layer 7 reinforces the mechanical connection between the components 8 and the conductive patterns 15, thus achieving a mechanically more durable construction.

Figure 29:
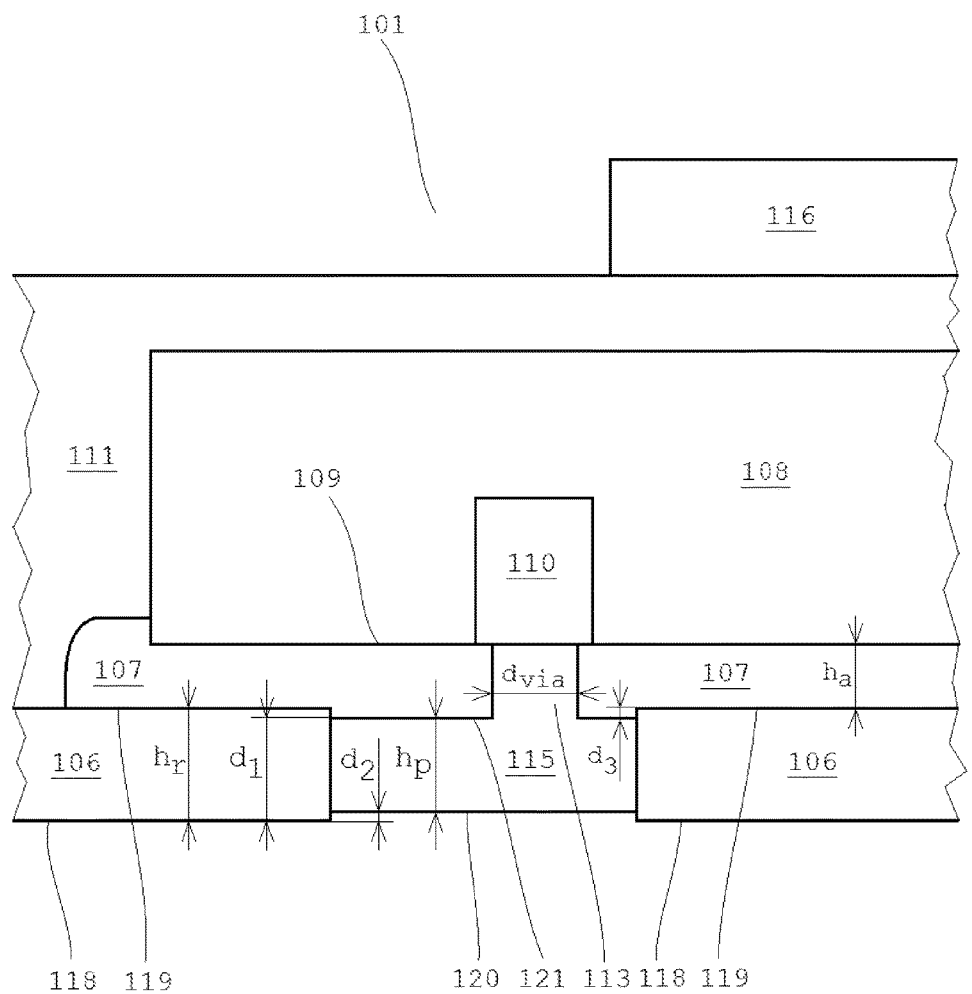
FIG. 29 illustrates a schematic view of an electronic module according to a fourth embodiment.

In FIG. 29 a schematic view of an electronic module 101 according to a fourth embodiment of the present invention is shown. The electronic module 101 has at least one component 108 embedded in a second insulating material layer 111.

A first insulating material layer 106 has a first surface 118, a second surface 119 and a thickness $h_r$. The first insulating material layer 106 is coupled to the second insulating material layer 111. The first insulating material layer 106 may be coupled to the second insulating material layer 111 by an adhesive layer 107. The second insulating material layer 111 may also be on at least a portion of the second surface 119 of the first insulating material layer. Additionally, at least one conductive pattern layer 115 having a first surface 120, a second surface 121 and a thickness $h_p$ is at least partially within an opening in the first insulating material layer 106.

The thickness $h_r$ of the first insulating material layer 106 can be greater than the distance $d_1$ between the first surface 118 of the first insulating material layer 106 and the second surface 121 of the at least one conductive pattern layer 115. The thickness $h_r$ of the first insulating material layer 106 can be less than $h_r=25$ [μm], for instance.

According to certain embodiments of the present invention, the thickness $h_r$ of the first insulating material layer 106 may be equal or greater than $h_r=25$ [μm]. According to an example, the distance $d_3=h_r-d_1$ can be in the range between $d_3=0.2$ [μm] and $d_3=5.0$ [μm]. The distance $d_3$ may also be equal or greater than $d_3=5.0$ [μm]. According to certain embodiments, the distance $d_2$ between the first surface 118 of the first insulating material layer 106 and the first surface of the at least one conductive pattern 115 can be greater than $d_2=0$ [mm], e.g. the two surfaces may not be flush. According to certain examples, the distance $d_2$ between the first surface 118 of the first insulating material layer 106 and the first surface of the at least one conductive pattern 115 may be $d_2=0$ [mm], e.g. the two surfaces may not be flush.

The electronic module 101 according to FIG. 29 is further shown with an adhesive layer 107 arranged between the second surface 119 of the first insulating material layer 106 and a contacting surface 109 of the at least one component 108. The thickness of the adhesive layer 107 can be in the range between $h_a=5$ [μm] and $h_a=15$ [μm], for instance. According to certain examples, the thickness of the adhesive layer 107 may be equal or greater than $h_a=15$ [μm]. According to yet another example, the thickness of the adhesive layer 107 may be less than $h_a=5$ [μm].

Furthermore, the electronic module 101 can have at least one via hole 113. The via hole 113 can be filled with a conductive material. The via hole 113 can connect the component 108 and the conductive pattern 115. According to an example, the distance $d_{via}$ of the cross section area of the via hole 113 can be less than $d_{via}=20$ [μm]. According to other examples, the distance $d_{via}$ of the cross section area of the via hole 113 may be equal or greater than $d_{via}=20$ [μm].

According to certain examples, at least one conductive layer or conductive pattern layer 116 can be arranged on top of the insulating layer 11. The at least one component 108 can be a passive component, a microcircuit, a semiconductor component. The component 108 may also be any other type of component.

In other examples the electronic module 101 may further comprise an additional polymeric layer as discussed above. The polymeric layer can be arranged between the second surface 119 of the first insulating material layer 106, the adhesive 107 and the surface of the insulating layer 111 facing towards the first insulating material layer 106.

Figure 30:
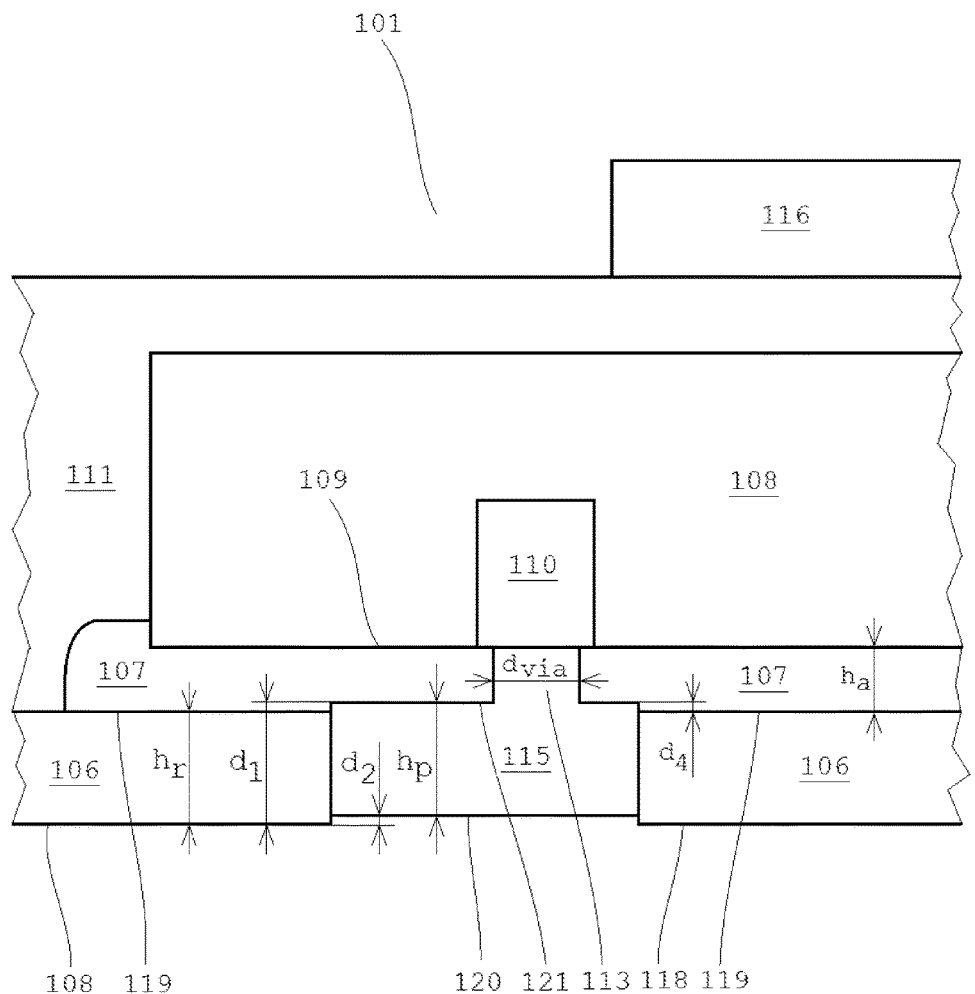
FIG. 30 illustrates a schematic view of an electronic module according to a fifth embodiment.

In FIG. 30 a schematic view of an electronic module 101 according to a fifth embodiment of the present invention is shown. The electronic module 101 with at least one component 108 embedded in a second insulating material layer 111 is comprising a first insulating material layer 106 having a first surface 118, a second surface 119 and a thickness $h_r$, and at least one conductive pattern 115 having a first surface 120, a second surface 121 and a thickness $h_p$. The distance $d_1$ between the first surface 118 of the first insulating material layer 106 and the second surface 121 of the at least one conductive pattern 115 is greater than the thickness $h_r$ of the first insulating material layer 106.

The thickness $h_r$ of the first insulating material layer 106 can be less than $h_r=25$ [μm], for instance. According to other embodiments of the present invention, the thickness $h_r$ of the first insulating material layer 106 may be equal or greater than $h_r=25$ [μm]. In an embodiment, the distance $d_4=d_1-h_r$ can usually be in the range between $d_4=0.2$ [μm] and $d_4=5.0$ [μm].

According to other embodiments of the present invention, the distance $d_4$ may be equal or greater than $d_4=5.0$ [μm]. In an embodiment, the distance $d_2$ between the first surface 118 of the first insulating material layer 106 and the first surface of the at least one conductive pattern 115 is greater than $d_2=0$ [mm]. According to other embodiments, the distance $d_2$ between the first surface 118 of the first insulating material layer 106 and the first surface of the at least one conductive pattern 115 may be $d_2=0$ [mm].

The electronic module 101 according to FIG. 30 is further comprising an adhesive layer 107 arranged between the second surface 119 of the first insulating material layer 106 and a contacting surface 109 of the at least one component 108. The thickness of the adhesive layer 107 can be in the range between $h_a=5$ [μm] and $h_a=15$ [μm], for instance. According to other embodiments, the thickness of the adhesive layer 107 may be equal or greater than $h_a=15$ [μm]. According to yet another embodiment, the thickness of the adhesive layer 107 may be less than $h_a=5$ [μm].

Furthermore, the electronic module 101 can comprise at least one via hole 113 filled with conductive material and connecting the component 108 and the conductive pattern 115. In an embodiment, the distance $d_{via}$ of the cross section area of the via hole 113 can be less than $d_{via}=20$ [μm]. According to other embodiments the distance $d_{via}$ of the cross section area of the via hole 113 may be equal or greater than $d_{via}=20$ [μm].

According to certain examples, at least one conductive pattern 116 can be arranged on top of the insulating layer 111. The at least one component 108 can be a passive component, a microcircuit, a semiconductor component, or any other type of component. The electronic module 101 may further comprise an additional polymeric layer. The polymeric layer can be arranged between the second surface 119 of the first insulating material layer 106, the adhesive 107 and the surface of the insulating layer 111 facing towards the first insulating material layer 106.

According to certain embodiments, an electronic module has a first insulating material layer having an opening therein, a second insulating material layer coupled to the first insulating material layer, a component at least partially embedded within the second insulating material layer at a position at least partially overlapping with the opening in the coupled first insulating material layer, and a conductive pattern layer at least partially within the opening of the first insulating material layer and electrically coupled to the component, wherein the conductive pattern layer is not flush with at least one surface of the first insulating material layer.

As can be seen in FIGS. 29 and 30, the conductive pattern 15 is situated so that it is not flush with the first insulating material layer 106. The conductive pattern layer can partially extend out of the opening in the first insulating material layer and in to the adhesive layer, e.g. as in FIG. 30. The adhesive layer may extend partially within the opening in the first insulating material layer as well, e.g. as in FIG. 29. There can also be a via in the adhesive layer through which the component is electrically coupled to the conductive layer.

The component can be entirely embedded within the second insulating material layer. The component can also be entirely embedded within the second insulating material layer and the adhesive layer.

Additionally, there can be at least two components that are at least partially embedded within the second insulating material layer. The at least two components can be at a position which corresponds with the opening in the first insulating material layer, and the at least two components can electrically connected to the conductive pattern layer. By corresponds, it is meant that the components are in alignment with the opening such that they can be electrically connected with the conductive pattern layer, for example as seen in FIG. 28.

The conductive pattern layer can be in the same plane with the first insulating material layer. Additionally according to certain embodiments, at least one surface of the conductive pattern layer is not flush with the corresponding surface of the first insulating material layer. As seen in FIGS. 29 and 30, neither surface of the conductive pattern layer is flush with either surface 118 or 119 of the first insulating material layer 106. The non flush surfaces of the conductive pattern layer and first insulating material layers can be the surfaces at or nearest to the interface with the second insulating material layer, e.g. 119 and 121.

Although the present invention has been described in detail for the purpose of illustration, various changes and modifications can be made within the scope of the claims. In addition, it is to be understood that the present disclosure contemplates that, to the extent possible, one or more features of any embodiment may be combined with one or more features of any other embodiment.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

LIST OF REFERENCE NUMBERS 1 electronic module
2 metal foil
3 release layer
4 first resist layer
5 via opening
6 second resist layer
7 adhesive
8 component
9 contacting surface
10 contact zone
11 insulating layer
12 conductive layer
13 via hole
14 lower conductive surface
15 conductive pattern
16 conductive patterns of conductive layer
17 polymeric layer
18 first surface of first or second resist layer
19 second surface of first or second resist layer
20 first surface of conductive pattern
21 second surface of conductive pattern
$d_1$ distance
$d_2$ distance
$d_3$ distance
$d_4$ distance
$d_{via}$ distance
$h_a$ thickness of adhesive layer
$h_p$ thickness of conductive pattern
$h_r$ thickness of resist layer
101 an electronic module
108 a component
111 second insulating material layer
106 first insulating material layer
118 first surface of a first insulating material layer
119 second surface of a first insulating material layer
115 conductive pattern layer
120 first surface of a conductive pattern layer
121 second surface of a conductive pattern layer
107 adhesive layer
109 contacting surface
113 via hole
116 conductive layer or conductive pattern layer
110 contact zone

The invention claimed is:

1. A method for fabrication of an electronic module with at least one component embedded in an insulating layer, the method comprising:
   a) arranging a release layer on a first surface of a conductive foil,
   b) arranging a first resist layer with pattern and/or via openings on top of the release layer and growing conductor material, the thickness of the first resist layer being greater or less than the thickness of the conductor material being grown,
   c) arranging an adhesive on top of or on top of a part of the resist layer and the conductor material being grown or on a contacting surface of at least one component, which has contact zones,
   d) placing the at least one component in such a way that the contacting surface faces towards a second surface of the resist layer and the positions of the contact zones coincide with the positions of the via openings,
   e) arranging an insulating layer in such a way that the at least one component is embedded in the insulating layer,
   f) removing the conductive foil and the release layer, and
   g) removing material from the via openings, thus forming via holes, and growing of conductor material in the via holes subsequent to placing the at least one component, thus electrically contacting the conductor material and the at least one component.

2. The method for fabrication of an electronic module according to claim 1, wherein an additional polymeric layer is made between the first resist layer and the adhesive.

3. The method for fabrication of an electronic module according to claim 1, wherein a second resist layer with pattern and via openings is arranged after step b) in such a way that a first surface of the second resist layer faces towards the first resist layer and conductor material is grown, the thickness of the second resist layer being greater or less than the thickness of the conductor material being grown.

4. The method for fabrication of an electronic module according to claim 1, wherein a second resist layer with pattern and via openings is arranged after step b) in such a way that a first surface of the second resist layer faces towards the first resist layer and conductor material is grown, the thickness of the second resist layer being greater or less than the thickness of the conductor material being grown, and after arranging a second resist layer an additional polymeric layer is made between a second surface of the second resist layer and the adhesive.

5. An electronic module comprising:
a first insulating material having a first surface, a second surface and a thickness between the first and second surface,
an opening through the first insulating material,
a second insulating material on at least a portion of the second surface of the first insulating material,
a component at least partially embedded in the second insulating material and electrically coupled to a conductive pattern,
a third insulating material between the component and the first insulating material,
wherein the conductive pattern is at least partially within said opening and the conductive pattern has a first surface opposite a second surface,
wherein the second surface of the conductive pattern faces the second insulating material and a distance between the first surface of the first insulating material and the second surface of the conductive pattern is less or greater than the thickness of the first insulating material, and
wherein connection elements in via holes are arranged between the conductive pattern and the component through the third insulating material, via the via holes coinciding with positions of contact zones of the component.

6. The electronic module of claim 5, wherein the component is electrically coupled to the conductive pattern by connection elements including conductive material deposited in a via hole in the first or second insulating material.

7. The electronic module of claim 5, wherein there is an adhesive layer in between the first and second insulating materials.

8. The electronic module according to claim 5, wherein the second insulating material on the second surface of the first insulating material includes a polymeric layer.

9. The electronic module according to claim 5, wherein a distance between the first surface of the first insulating material and the first surface of the at least one conductive pattern is greater than zero.

10. The electronic module according to claim 5, wherein the conductive pattern is arranged on the second insulating material.

11. An electronic module comprising:
a first insulating material layer having an opening therein,
a second insulating material layer coupled to the first insulating material layer,
a component at least partially embedded within the second insulating material layer at a position at least partially overlapping with the opening in the coupled first insulating material layer,
a third insulating material layer between the component and the first insulating material layer,
a conductive pattern layer at least partially within the opening of the first insulating material layer and electrically coupled to the component, wherein a thickness of the conductive pattern layer is less than a thickness of the first insulating material layer, and
connection elements in via holes arranged between the conductive pattern layer and the component through the third insulating material, the via holes coinciding with positions of contact zones of the component.

12. An electronic module according to claim 11, further comprising an adhesive layer between, and coupling, the first and second insulating material layers.

13. An electronic module according to claim 12, wherein the conductive pattern layer partially extends out of the opening in the first insulating material layer and in to the adhesive layer.

14. An electronic module according to claim 12, wherein the adhesive layer extends partially within the opening in the first insulating material layer.

15. An electronic module according to claim 12, further comprising a via in the adhesive layer through which the component is electrically coupled to the conductive layer.

16. An electronic module according to claim 12, wherein the component is entirely embedded within the second insulating material layer and the adhesive layer.

17. An electronic module according to claim 11, wherein the component is entirely embedded within the second insulating material layer.

18. An electronic module according to claim 11, wherein at least two components are at least partially embedded within the second insulating material layer, the at least two components are at a position which corresponds with the opening in the first insulating material layer, and the at least two components are electrically connected to the conductive pattern layer.

19. An electronic module according to claim 11, wherein the conductive pattern layer is in the same plane with the first insulating material layer, and wherein at least one surface of the conductive pattern layer is not flush with the corresponding surface of the first insulating material layer.

20. An electronic module according to claim 19, wherein the non flush surfaces of the conductive pattern layer and first insulating material layers are the surfaces at or nearest to the interface with the second insulating material layer.

* * * * *